United States Patent [15] 3,665,200
Zaubitzer [45] May 23, 1972

[54] OPTO-ELECTRONIC TIMING SWITCH

[72] Inventor: Richard Zaubitzer, Frankfurt am Main, Germany

[73] Assignee: Siemens Aktiengesellschaft, Berlin, Germany

[22] Filed: Nov. 18, 1970

[21] Appl. No.: 90,637

[30] Foreign Application Priority Data

Nov. 26, 1969 Germany......................P 19 59 357.8

[52] U.S. Cl. ..........................250/217 R, 250/206, 307/117, 317/130

[51] Int. Cl. ......................................G02f 1/28, H01j 39/12

[58] Field of Search .........................250/206, 71.5 R, 217 R; 307/117; 317/130, 148.5

[56] References Cited

UNITED STATES PATENTS 2,899,560 8/1959 Nemet..............................250/71.5 R
3,334,235 8/1967 Zarowin............................250/217 R
3,510,661 5/1970 Aston................................250/206 X
3,514,673 5/1970 Newton.............................307/117 X

*Primary Examiner*—Walter Stolwein
*Attorney*—Curt M. Avery, Arthur E. Wilfond, Herbert L. Lerner and Daniel J. Tick

[57] ABSTRACT

An optoelectronic timing switch comprises a monostable bistate amplifier which furnishes an electric output signal when in one of its two states. The amplifier has an input which, as long as it receives an electric signal above a threshold intensity, maintains the switch in non-stable state. A radiation pulse source illuminates a phosphorescent layer to whose brightness a radiation detector is responsive, this detector being electrically connected with the amplifier input. The phosphorescent layer has an effective afterglow persistence of longer duration than the pulse duration of the source in order to maintain the amplifier input signal above the threshold intensity for a prolonged timing period.

18 Claims, 3 Drawing Figures

Fig.1
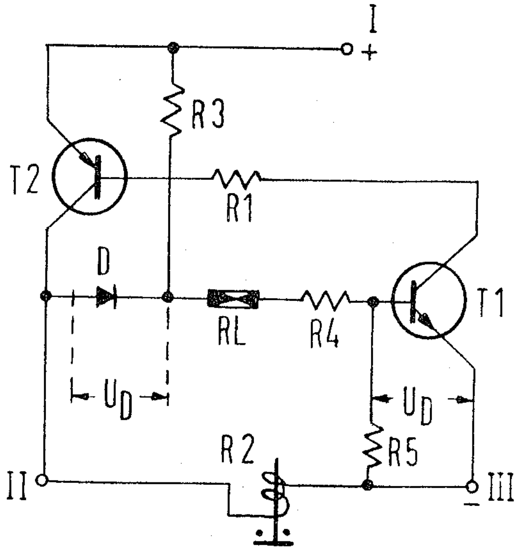
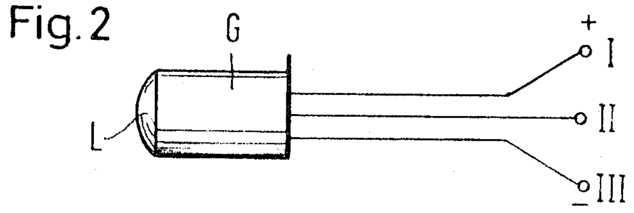
Fig.3
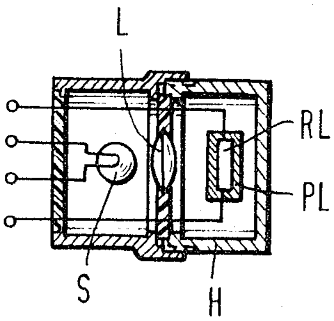

OPTO-ELECTRONIC TIMING SWITCH

My invention relates to optoelectronic timing switches suitable as a time-delay stage or for such purposes as pulse expansion or digital pulse-frequency division.

Aside from thermally actuated timing switches, such as bimetal strips or contact thermometers, there are numerous electronic time delay switches operating on the RC principle. Such RC type devices require large capacitors if long timing periods are to be attained. Thus, a delay range of minutes to hours, may require capacitance values of up to 1,000$\mu$F or more. Of course, electrolytic capacitors of such large capacitance values demand a correspondingly large amount of space which, in most cases, by far exceeds the entire volume of the other electronic circuit components.

It is an object of my invention to do away with such large electrolytic timing capacitors by resorting to optoelectronics. In principle, optoelectronic devices consist of a radiation source and a radiation detector which are optically coupled or feed-back coupled with each other. The coupling and feedback may in part be electrical.

It is known for optoelectronic ring counters to have the individual counting stages composed of a light issuing capacitor to serve as a radiation source, and of at least two photo-semiconductors to serve as radiation detectors. These ring counters utilize the optical retardation of the photo-semiconductors for delaying purposes. However, the internal time constant of photoresistors is in the order of 10 to 100 milliseconds which makes it infeasible with such devices to attain a time delay in the order of minutes or hours.

Also known are optoelectronic counter stages which are composed of a sequence of electroluminescent and photoconductive layers and in which the delaying effects of the electroluminescent layers are utilized. With such electroluminescent layers, the so-called Cudden-Pohl effect comes into play. Zinc-sulfide crystals with a high dopant content of copper will instantaneously light up brightly in an electric alternating field, thus instantaneously converting the field energy into radiation. Due to the high copper content only very few centers of persistent illumination are being formed. Hence, the afterglow persistence is very short, far below 1 second. For this reason, the delaying time of electroluminescent layers is likewise not suitable to meet the above-mentioned object of my invention.

It is therefore a more specific object of my invention to devise an optoelectronic timing switch that readily affords obtaining much longer timing periods, such as in the order of minutes or hours, than can be achieved with the above-mentioned known devices.

Another object of the invention to provide an optoelectronic timing switch, that readily permits being automatically regulated for maintaining an accurately defined or pre-set timing period.

Still another object of the invention, related to those already mentioned is to make an optoelectronic timing switch readily adjustable, within a wide range, to any desired length of its timing period.

To achieve these objects I provide an optoelectronic switching device which, like those according to prior art, comprises a primary source of photon radiation whose photon pulses are released by the input signal of the device, and which also comprises a radiation detector optically coupled with the primary pulse source for controlling a switching amplifier that furnishes the electrical output signal of the equipment. According to an essential feature of my invention, the amplifier is a bistate, monostable device and a prolonged switching delay of this amplifier is secured by virtue of the fact that I arrange between the primary radiation source and the radiation detector a phosphorescent layer of such a long afterglow persistence that the radiation detector, in accordance with the sum of light received from the primary radiator and depending upon the input-signal threshold of the switching amplifier, remains during the desired period of time below the electrical resistance value required for the amplifier to switch back from its non-stable to its stable state.

Depending upon whether long or short switching delays are required, a coarse dimensioning of a timing switch according to the invention can be effected by a corresponding selection of the phosphorescent substance used in the intermediate afterglow layer.

Within the range thus determined by the selection of the phosphorescent material, the timing period of the switching device can be varied within wide limits by providing for a different intensity and different duration of the primary radiation source excitation, that is by providing for a different sum of light impinging upon the phosphorescent layer.

Still another adjusting or regulating possibility for the time delay in devices according to the invention is afforded by electronically varying the respective threshold values at which the switching amplifier will switch from its stable to its non-stable state and back, respectively.

It will be apparent that such a long-time delay switch is applicable for a variety of purposes in digital and analog techniques. A preferred use is the expansion of a pulse. However, devices according to the invention are also suitable as optoelectronic digital integrators.

The radiation detector in a timing switch according to the invention may consist of a photo-resistor or photo-transistor. The phosphorescent layer, preferably, is constituted by a coating or envelope which fully surrounds the radiation detector and consists of a transparent phosphorescent layer of long afterglow persistence. Advantageously applicable as such phosphorescent layers of prolonged afterglow duration are phosphorescent paints or the like materials on the basis of zinc sulfide, zinc-cadmium sulfide, calcium sulfide, barium sulfide or strontium sulfide. The luminescent pigments are preferably embedded in a clear-drying chemical neutral, colorless and transparent substance, in the immediate vicinity of the active i.e. irradiated surface layer of the radiation detector. Luminescent pigments or dyes on zinc sulfide basis exhibit a green afterglow which decays rather slowly, as compared with yellow, orange or red afterglow substances on zinc-cadmium sulfide basis.

Particularly advantageous in timing switches according to the invention are strontium-sulfide phosphors (activator: bismuth) having an extreme afterglow persistence, such as 8 to 10 hours.

According to another feature of my invention, a compact component is obtained by a accommodating the switching amplifier with the radiation detector in a light-tight cylindrical housing or can, which carries a lens on one of its end sides for the ingress of radiation.

For obtaining a still further miniaturization, it is preferable to mount the primary radiation source, such as a micro-incandescent bulb in a common housing or can together with the phosphorescent layer of long afterglow persistence and together with the radiation detector. In such a miniature component, the detector is preferably enveloped in the phosphorescent layer.

Also suitable as primary source of radiation are gas discharge lamps, for example a flash lamp, or a semiconductor luminescence diode, for example a galium arsenide luminescent diode. In certain cases, the primary radiator may also be constituted by daylight.

A particularly advantageous and preferable design of the switching amplifier in devices according to the invention is obtained by electrically connecting a photo-resistive detector, surrounded by a phosphorescent layer of long afterglow persistence, in series with a diode and ahead of a limiting resistor, between the base of an npn-transistor and the collector of a pnp-transistor, the load impedance or resistance being connected between the emitter of the npn-transistor and the negative pole of the operating voltage source. Within such circuitry the base of the npn-transistor is connected through a high-ohmic resistor to the negative pole of the feed voltage source, and a circuit point between the diode and the photo-resistor is connected through another high-ohmic series resistor with the positive pole of the feed voltage.

The load impedance or resistance of the switching amplifier, of course, may be constituted by the winding of a relay.

The above-mentioned and other objects, advantages and features of my invention, said features being set forth with particularity in the claims annexed hereto, will become apparent from, and will be mentioned in, the following description of an embodiment of the invention illustrated by way of example on the accompanying drawing in which FIG. 1 is an electric circuit diagram of the timing switch;

FIG. 2 shows the same switch encapsulated in a housing that receives the primary light pulses from the outside; and FIG. 3 shows schematically in a section a device in which the essential components are encapsulated within a common housing together with the source of the primary optical pulses.

Referring to FIG. 1, the illustrated timing switch comprises a bistate, monostable amplifier whose essential amplifying components are constituted by two complementary transistors T1 and T2. In this embodiment the transistor T1 is of the npn-type and has its emitter connected to the negative pole or terminal III of the feed-voltage supply; and the transistor T2 is of the pnp-type, having its emitter connected to the positive pole or terminal I of the feed-voltage supply. It will be obvious that the transistor types are mutually exchangeable, provided care is taken to correspondingly polarize the voltage connections. The output circuit of the amplifier extends between terminals II and III and contains the load impedance R2 here shown as the coil of an electromagnetic relay.

The control circuit of the amplifier extends from the collector of transistor T2 to the base of transistor T1 and contains in series a diode D, a photoresistive detector RL and a current-limiting resistor R4. A circuit point between D and RL is connected through a high-ohmic resistor R3 to the positive terminal I; but, due to the high resistance of R3 and the resistance of the detector, when dark, the transistor T1 normally remains turned off, and the base of transistor T2, being connected by a resistor R1 to the collector of T1, receives no current so that T2 likewise is turned off. Hence, no current flows in the load circuit of R2. When the detector RL received photons from a primary pulse source PS, such as a gaseous flash lamp, it greatly reduces its resistance so that transistor T1 is controlled with the effect that transistor T2 is turned on and conducts current through the load R2 between terminals I and III.

In the exemplified embodiment, as made and tested, the radiation detector RL consisted of a flat Cds-photo-resistor of commercial type which was coated with a luminescent material of green afterglow available in the trade as "Gruen-N". The npn-transistor T1 was of the type commercially available under the designation BCY 59. The pnp-transistor T2 was of the type commercially available under the designation BCY 79. The primary radiation source was constituted by an incandescent bulb rated for 6 V, 0.2 A and was located in the immediate vicinity of the luminescently coated detector RL. Depending upon the dosage of the exciting optical radiation, the illustrated device afforded obtaining timing periods in the range of minutes to hours.

According to FIG. 2, the photo-resistor RL, enveloped in a coating of phosphorous material of long afterglow persistence, is mounted in an opaque cylindrical housing G. The primary radiation source is located outside of the housing and its radiation is directed to a lens L at one end of the housing for concentrating the illuminating pulses upon the phosphorescent layer PL. Also mounted with the housing G of FIG. 2 is the switching amplifier according to FIG. 1, with the exception of the load impedance $R_2$. Consequently, the entire timing switch unit has only three externally accessible terminals I and II, and III. The terminals I and II are to be connected to positive and negative poles respectively of the constant feed voltage. The load, such as the relay $R_2$, is to be connected between the terminals II and III.

More in detail, the performance of the above-described timing switch according to the invention is as follows.

Assume that the photoresistor RL in FIG. 1 with its layer of phosphorescent material PL (FIG. 2) is dark. In this condition the resistance of PL is about 100 MΩ. At a constant feed voltage of 6 V, virtually no current can flow through the resistor R3 of 10 MΩ, the photoresistor RL (100 MΩ), the protective series resistor R4 (1kΩ) and the base emitter resistor R5 (1 MΩ). Since no base current flows in transistor T1, the voltage drop at the base emitter resistor R5 being 0 Volt, the transistor T1 does not furnish a collector current for controlling the transistor T2. The collector resistor R2, constituting the relay or other load of the device, remains deenergized.

Now assume that the primary radiation source furnishes a short-lasting pulse and thus a defined illumination of the phosphorescent mass on photoresistor RL. Due to the transparency of the phosphorescent layer, the photoresistor RL receives a strong initial pulse of light which reduces the resistance of RL abruptly to approximately 100Ω. Now a correspondingly intensive emitter-base starting current flows in the transistor T1 which amplifies this current and thereby causes the transistor T2 to be turned on. The collector current of T2 flows through the load R2. When the resulting collector current of the transistor T2 is large enough to produce an appreciable voltage drop at the load impedance $R_2$, that is if this voltage drop is larger than twice the diode voltage $U_D$ together with the voltage drops RL and $R_4$, then the transistor currents amplify each other until the amplifying system is controlled up to saturation. This is because then a control current of high intensity has been adjusted to flow through the diode D so as to continuously maintain the emitter path of transistor T1 in the condition required to keep this transistor conductive, the turned-on current being limited to a permissible value by the effect of the protective resistor R4.

Since the resistances of resistors R1, R2, R4, R5 and RL, as well as the median current amplifying (gain) factors $v_1$, $v_2$ and the diode pass voltage $U_D$ are known, a limit operating voltage $U_B$ can be calculated from these data to constitute the minimum threshold which, when exceeded, will reliably secure the above-described switching-on state of the timing switch when the phosphorescent layer is being illuminated. The calculation of the limit voltage $U_B$ is in accordance with the formula:

$$U_B = U_D \cdot \left[ \frac{(R_3+R_4+R_L)\cdot 2 + v_1 \cdot v_2 \cdot \dfrac{R_2}{R_5}}{v_1 \cdot v_2 \cdot R_2 - R_L - R_4} + 1 \right];$$

When the illumination of the phosphorescent layer ceases, its afterglow decays slowly in accordance with the stored sum of light, and accordingly, the photo-resistance of the detector slowly increases. During this stage, however, the on-state of the amplifier system remains preserved without change and keeps on furnishing a constant current through the load *R2* until the photo-resistence of the detector RL has increased to such a high limit value that the further maintenance of the amplifier system in the on-state is no longer secured and the previously constant collector current of transistor T2 commences to decrease. This has the consequence that the voltage drop at the load *R2* will also slightly decline. This acts through the diode D in cooperation with resistor R5, to abruptly switch off the collector current of transistor T2 previously flowing through the load *R2*. The critical limit value $R_{Ltm}$ of the photo-resistor RL is now determined by the equation $$R_L = \frac{R_2 \cdot R_5 \cdot v_1 \cdot v_2 \cdot (U_B - U_{sat_{T2}} - 2U_D)}{R_5 \cdot (U_B - U_{sat_{T2}}) + U_B \cdot R_2 \cdot v_1 \cdot v_2} - R_4;$$

Depending upon the behavior of the phosphorescent material with respect to its initial brightness and the decay of its own radiation on the one hand, and the dosage of the supplied primary radiation on the other hand, the critical limit value $R_{Ltm}$ for the discontinuance of the collector current from transistor current T2 occurs after a given interval of time, this being the time-delay period of the system.

As explained, the selection of the most favorable phosphorescent material depends upon whether the timing switch according to the invention is to have a relatively short or relatively long timing period, the selection being made in accordance with the decaying characteristic of the phosphorescent material.

Of course, the voltage at the load impedance of resistance $R_2$ can be utilized as a time-determining criterion for further electronic circuits.

It will be understood from the embodiments described in the foregoing that in a timing switch according to the invention, the time-determining element constituted by a photoresistor and coated with phosphorescent material, may be given a miniaturized size. The actuation of one or, simultaneously, of several such timing switches according to the invention can also be effected readily by radiation from large distances so that a system according to the invention is also suitable for wireless remote control purposes.

To those skilled in the art, it will be obvious from a study of this disclosure, that may invention permits of a great variety of modifications and hence may be given embodiments other than those particularly illustrated and described herein, without departing from the essential features of the invention and within the scope of the claims annexed hereto.

I claim:

1. An optoelectronic timing switch, comprising a monostable switching amplifier having an output signal in one of its two states, said amplifier having a control circuit for maintaining said amplifier in its non-stable state as long as said circuit furnishes an electric input signal above a threshold intensity; a radiation pulse source; a phosphorescent layer optically in front of said source; a radiation detector responsive to the glow intensity of said layer and electrically connected in said amplifier control circuit to control said electric input signal; said phosphorescent layer having an effective afterglow persistence longer than the pulse duration to maintain said amplifier input signal above said threshold intensity for a prolonged timing period.

2. An optoelectronic timing switch, comprising primary radiation pulse means for issuing photon pulses, a radiation detector optically coupled with said primary radiation pulse means and having an optically variable electric parameter, a phosphorescent layer interposed between said primary pulse means and said detector, a switching amplifier connected to and controllable by said detector to issue a switch output pulse as long as the amplifier input controlled by said detector is above a threshold magnitude, said phosphorescent layer having an effective afterglow period of longer duration than said respective primary radiation pulses so as to maintain said electric parameter of said detector above a value at which the sum of radiation from said primary radiation pulse means keeps said amplifier input magnitude above said threshold, whereby said switching amplifier stops delivering said output pulse upon elapse of a desired timing period of prolonged duration relative to that of said respective primary pulses.

3. An optoelectronic timing switch, comprising a trigger circuit with a switching amplifier having two states, control means for applying a control signal to said amplifier and feedback means for biasing said amplifier to one of said two states if the control signal is below a threshold value; said control means including a photosensitive member, a primary photoelectric emission device for emitting photons in response to a control voltage, and secondary photon emission means furnishing a fading photoemission upon and after being excited by photons, said secondary photon emission means being arranged between said primary device and said photosensitive member so as to be exposed to the photon emission of said primary device.

4. In a timing switch according to claim 1, said detector being a photo-resistor.

5. In a timing switch according to claim 1, said phosphorescent layer extending around said radiation detector.

6. In a timing switch according to claim 1, said phosphorescent layer forming a coating on said radiation detector and being at least in part transparent to said radiation pulses.

7. In a timing switch according to claim 1, said phosphorescent layer consisting substantially of phosphorescent paint material containing as the active phosphorescent substance at least one of the sulfides of zinc, zinc-cadmium, calcium, barium and strontium.

8. In a timing switch according to claim 7, said phosphorescent sulfide being embedded in a clear, colorless carrier substance in proximity to the radiation-exposed surface of said detector.

9. A timing switch according to claim 1, comprising an opaque housing, said amplifier and said detector being mounted in said housing.

10. In a timing switch according to claim 9, said radiation pulse source being outside of said housing, a lens being mounted on one end of said housing for passing and concentrating said radiation pulses upon said phosphorescent layer in said housing.

11. In a timing switch according to claim 9, said radiation pulse source being also mounted inside said housing.

12. In a timing switch according to claim 11, said radiation pulse source being a micro-incandescent lamp.

13. In a timing switch according to claim 11, said radiation pulse source being a flash lamp.

14. In a timing switch according to claim 1, said bistate switching amplifier comprising feed voltage supply means having respective positive and negative terminals, two complementary npn- and pnp-transistors, a load and the emitter-collector path of a first one of said transistors being serially connected between said two feed voltage terminals, the emitter-collector path of said second transistor being connected between one of said terminals and the base of said first transistor, a high-ohmic resistor connecting the base of said second transistor to said one terminal, a diode and a current limiting resistor connected in series with said radiation detector between said base of said second transistor and a circuit point intermediate said load and said first transistor, and another high-ohmic resistor connecting said other feed-voltage terminal with a circuit point intermediate said diode and said detector.

15. In a timing switch according to claim 14, said first transistor being of the pnp-type, said second transistor being of the npn-type, said one feed-voltage terminal being negative, and said other terminal being positive.

16. In a timing switch according to claim 14, said load being a relay winding.

17. In a timing switch according to claim 1, said radiation pulse source having a short pulse duration as compared with the interpulse intervals, and said optoelectronic timing switch being a pulse expander for providing an effective electric output pulse of proportionally longer persistence than said pulse duration.

18. In a timing switch according to claim 1, said radiation pulse source having a periodic pulse output in the form of variable-length trains of individual radiation pulses, and said timing period being longer than the cycle period of the individual pulses in said trains, whereby said optoelectronic switch operates as a digital integrator.

* * * * *